United States Patent [19]
Bodenhausen et al.

[11] Patent Number: 5,285,156
[45] Date of Patent: Feb. 8, 1994

[54] MEASUREMENT OF CROSS-RELAXATION RATES BETWEEN SELECTED PAIRS OF NUCLEI

[75] Inventors: Geoffrey Bodenhausen, Pully; Irene Burghardt, Renens; Robert Konrat, Morges; Sebastien Vincent, Lausanne, all of Switzerland

[73] Assignee: Spectrospin AG, Switzerland

[21] Appl. No.: 891,156

[22] Filed: May 28, 1992

[30] Foreign Application Priority Data

May 30, 1991 [EP] European Pat. Off. ........ 91 108878.9

[51] Int. Cl.$^5$ ............................................. G01R 33/00
[52] U.S. Cl. ..................................................... 324/307
[58] Field of Search ............... 324/300, 307, 309, 310, 324/311, 312, 313, 314, 318, 322; 128/653.1, 653.2, 653.5

[56] References Cited

U.S. PATENT DOCUMENTS

| | | | |
|---|---|---|---|
| 3,714,551 | 1/1973 | Pajak et al. | 324/313 |
| 3,795,856 | 3/1974 | Keller | 324/310 |
| 3,975,675 | 8/1976 | Dunard et al. | 324/312 |
| 4,238,735 | 12/1980 | Mullet | 324/310 |
| 4,345,207 | 8/1982 | Bertrand et al. | 324/308 |

OTHER PUBLICATIONS

Chemical Physics Letters vol. 165 No. 6 p. 469 (Feb. 2, 1990) Lyndon Emsley & Geoffrey Bodenhausen.
Journal of Magnetic Resonance vol. 82 p. 211 (1989) Lyndon Emsley & Geoffrey Bodenhausen.
Journal of Magnetic Resonance vol. 89, No. 3 p. 620 (1990) Susan M. Holl et al.

Primary Examiner—Michael J. Tokar
Attorney, Agent, or Firm—Walter A. Hackler

[57] ABSTRACT

A method for measuring cross-relation rates in high-resolution nuclear magnetic resonance (NMR) spectroscopy in which in a homogeneous static magnetic field $B_0$ in a direction of a z-axis which causes alignment of longitudinal components $I_z^A$, $I_z^X$ of magnetization vectors $I^A$, $I^X$ of nuclei A, X during a time interval $\tau_m$ a sample substance, preferably dissolved in liquid, with nuclei A and X having different chemical shifts $\Omega_A$ and $\Omega_X$ is irradiated with a radio-frequency (rf) field and afterwards by action of a suitable rf-pulse sequence the longitudinal magnetization is transferred into a transverse magnetization creating a rf-signal received by a detector, is characterized in that the rf field is composed by at least two weak, selective component fields, the frequencies of these fields being chosen such that the magnetization vectors $I^A$ and $I^X$ are made to nutate in synchronous fashion, the remaining spins of the sample substance substantially being unaffected by this process.

25 Claims, 6 Drawing Sheets

MEASUREMENT OF CROSS-RELAXATION RATES BETWEEN SELECTED PAIRS OF NUCLEI

BACKGROUND OF THE INVENTION

The present invention relates to a method for measuring cross-relation rates in high-resolution nuclear magnetic resonance (NMR) spectroscopy in which in a homogeneous static magnetic field $B_0$ in direction of a z-axis which causes alignment of longitudinal components $I_z^A$, $I_z^X$ of magnetization vectors $\vec{I}^A$, $\vec{I}^X$ of nuclei A, X during a time interval $\tau_m$ a sample substance, preferably dissolved in liquid, with nuclei A and X having different chemical shifts $\Omega_A$ and $\Omega_X$ is irradiated with a radio-frequency (rf) field and afterwards by action of a suitable rf-pulse sequence the longitudinal magnetization is transferred into a transverse magnetization creating a rf-signal received by a detector.

Such a method is known from the textbook by D. Neuhaus and M. P. Williamson, The Nuclear Overhauser Effect in Structural and Conformational Analysis, Verlag Chemie, 1989.

Ever since Solomon's celebrated work it has been obvious that the measurement of cross-relaxation rates may provide a unique approach to the determination of internuclear distances in solution. Cross-relaxation, also referred to as the Overhauser effect, leads to a partial exchange of longitudinal magnetization components $I_z^A$ and $I_z^X$. The rate of this process is in principle proportional to the inverse sixth power of the internuclear distance $r_{AX}$. However, the trouble with cross-relaxation phenomena is that they are easily perturbed by the presence of further spins. For example, if there is a third spin M such that $r_{AM}$ and $r_{MX}$ are both smaller than $r_{AX}$, the conversion of $I_z^A$ into $I_z^X$ via $I_z^M$ will be much faster than the direct exchange of $I_z^A$ and $I_z^X$, so that the measurement of the distance $r_{AX}$ becomes unreliable. Only in isolated spinpairs can one hope to measure distances with reasonable accuracy. In larger spin systems, the initial rate approximation is often invoked to justify the use of the two-spin approximation. Although this approximation is certainly acceptable for dominant interactions, it cannot be applied to weaker long-range Overhauser effects that tend to be overshadowed by stronger interactions.

Therefore, it is an object of the present invention to circumvent the fundamental difficulties described above and to present a method for measuring cross-relaxation rates which can still be used in those cases where the normal nuclear Overhauser effect in the laboratory-frame is perturbed by the presence of further spins.

This object is achieved by the present invention in that the rf field is composed by at least two weak, selective component fields, the frequencies of these fields being chosen such that the magnetization vectors $\vec{I}^A$ and $\vec{I}^X$ are made to nutate in synchronous fashion, the remaining spins of the sample substance substantially being unaffected by this process.

The nuclei are irradiated simultaneously with the sidebands of an usually amplitude-modulated rf field, so that their magnetization vectors are synchronously forced into a nutation movement. While the magnetization of the two selected nuclei A and X in a molecule are being stirred in this manner, cross-relation between the nuclear spins can occur in a manner that closely resembles the exchange in the laboratory-frame described by Solomon's equations. Suitably prepared initial conditions lead to simple exponential decays. The cross-relaxation rates may then be derived from the difference of the decay rates. Internuclear distances between selected nuclei may then be derived from these cross-relaxation rates, and this even in cases where normal Overhauser effects are perturbed by the presence of further spins.

The simplest realization of the method according to the present invention assuming that there is no weak coupling $J_{AX}$ between the spins of the nuclei A and X is that the amplitudes and the frequencies of the component fields are chosen such that together they form an amplitude-modulated rf field in direction of a y-axis orthogonal to the z-axis with a carrier frequency $\omega_{rf}=\frac{1}{2}(\Omega_A+\Omega_X)$ and two sideband frequencies $\omega_{rf}+\omega_a$ and $\omega_{rf}-\omega_a$, $\omega_a$ meaning $\omega_a=\frac{1}{2}(\Omega_A-\Omega_X)$.

In particular, a mere sinusoidal amplitude modulation may be chosen such that the field amplitude of the composed rf field follows the function $2\gamma h d\ 1B_1 \cos\Omega_a t$, $\gamma_1 B_1 2\pi$ meaning the amplitude of the two sidebands.

In systems with scalar couplings of the spins of the nuclei A and X to other nuclei (eg. M, k) the sideband amplitudes $\gamma_1 B_1/2\pi$ are chosen sufficient to stir the spins of the nuclei A and X with the same nutation frequency, but to be weak enough so that the spins of all neighboring other nuclei are not affected, in particular $10\ \text{Hz} \leq \gamma_1 B_1/2\pi \leq 100\ \text{Hz}$, preferably $\gamma_1 B_1/2\pi \approx 50\ \text{Hz}$.

If the time interval $\tau_m$ is chosen to be an integer multiple of the duration of a modulation cycle $2\pi/\gamma_1 B_1$, the magnetization of the nuclei A and X lies completely along the z-direction at the end of the irradiation with the composed rf field.

In a further embodiment of the method according to the present invention a composed rf field which is modulated both in amplitude and phase is irradiated. When doing so the phases of the component fields are spaced from each other by 90° and their amplitudes and frequencies are chosen such that together they yield a phase-modulated rf field orthogonal to the z-axis with a carrier frequency $\omega_{rf}=\frac{1}{2}(\Omega_A+\Omega_X)$ and two sideband frequencies $\omega_{rf}+\omega_a$ and $\omega_{rf}-\omega_a$.

In a preferred embodiment the field amplitude of a component field follows the function $\gamma_1 B_1 \cdot \cos\omega_a t$ and the field amplitude of a component partial field follows the function $\gamma_2 B_2 \cdot \cos\omega_a t \cdot \cos\gamma_1 B_1 T$. This a kind of spin-lock of the magnetization vectors $\vec{I}^A$ and $\vec{I}^X$.

In order to obtain an optimal observable signal the spin-lock pulse has to be interrupted after an integer number of spin cycles of the duration $2\pi/\gamma_2 B_2$, which can be achieved by choosing the time interval $\tau_m$ to be an integer multiple of a cycle duration $2\pi/\gamma_2 B_2$.

With the rf field, which is modulated both in amplitude and phase in the case of scalar couplings to spins of neighboring other nuclei the field amplitude of the component fields should also be weak enough so that the spins of neighboring other nuclei are not affected, just as with the above mentioned embodiment of a mere amplitude-modulated rf field. On the other hand, the rf amplitude should be sufficient to lock the resonances of the spins of the nuclei A and X. Therefore, in a preferred embodiment, the extreme amplitudes $\gamma_1 B_1/2\pi$ and $\gamma_2 B_2/2\pi$ are chosen so that $10\ \text{Hz} \leq \gamma_1 B_1/2\pi \leq 100\ \text{Hz}$, preferably $\gamma_1 B_1/2\pi \approx 50\ \text{Hz}$, and $\gamma_1 B_1/\gamma_2 B_2 \geq 1$, particularly $\gamma_1 B_1/\gamma_2 B_2 \approx 10$.

In an especially preferred embodiment the phases of all component fields are switched through 180° at least once during the time interval $\tau_m$. Thus the negative effect of an inhomogeneous broadening of the induced nutation frequencies due to non-ideal homogeneous rf fields can be minimized, which results in a refocussing of inhomogeneous dephasing.

For reasons of symmetry it is advisable to switch the phases during a time interval $\tau_m$ at an odd number and to choose the time duration $\tau_{180}$ of the irradiation of the rf field with a phase switched through 180° to be equal to the time duration $\tau_0$ of the irradiation of the rf field with a phase switched through 0°.

In order to avoid destructive interferences, the time durations of the single intervals with switched phase are preferably chosen to be equal and an odd multiple of $\tau/\omega_a$.

With embodiments of the present invention, the sample substance prior to irradiation of the composed rf field can be irradiated with a suitably shaped selective rf pulse sequence causing an inversion of the spin polarization of the nuclei X in relation to the nuclei A, in order to set up the defined initial condition of an anti-symmetric state $=I_z^A-I_z^X$ with antiparallel spins of the nuclei A and X.

Such a selective rf pulse sequence may consist of a $G^3$-Gaussian cascade, as it is described in an article by L. Emsley and G. Bodenhausen in Chem. Phys. Lett. 165, 469 (1990).

Improved characteristic may be obtained with band-selective "uniform response pure phase" pulses, which are proposed by H. Geen, S. Wimperis and R. Freemann in J. Magn. Reson. 85, 620 (1989).

However, selective inversion of the spin polarization can never be perfectly realized in practice. The really-achievable antisymmetric initial state with anti-parallel spins will thus always differ from the ideal eigenstate of the system, leading to a more or less bi-exponential decay of the spins. In contrast thereto, the symmetric eigenstate $\Sigma=I_z^A+I_z^X$ with parallel spins of the nuclei A and X always shows mono-exponential decay. With other embodiments of the present invention the symmetry is restored in that prior to irradiation of the composed rf field the sample substance is irradiated with a rf pulse sequence which excites transverse magnetization of the nuclei A and X.

Preferably the rf pulse sequence is modulated in amplitude by $\sin\omega_a t$ or $\cos\omega_a t$. Thus phase-correct transverse magnetization is excited via well-defined narrow band widths.

In doing so, the 270° Gaussian pulse described in an article by L. Emsley and G. Bodenhausen in J. Magn. Reson. 82, 211 (1989) may be applied as rf pulse sequences.

In case that the experimental conditions are not quite ideal the defined initial states with transverse magnetization may also be achieved in that $G^4$ Gaussian pulse cascades are chosen as selective rf pulse sequences which are also described in the above cited article by L. Emsley and G. Bodenhausen in Chem. Phys. Lett. 165, 469 (1990).

If scalar coupling occurs between the spins of the nuclei A and X, i.e. if the scalar coupling constant $J_{AX}\neq 0$, there will be a coherent exchange of magnetization between the nuclei A and X. This will not affect the measuring results if the system at the beginning of the time interval $\tau_m$ is in a symmetric phase-equal magnetization state $\Sigma=I_z^A+I_z^X$, $\Sigma'=I_x^A+I_x^X$ or $\Sigma''=I_y^A+I_y^X$.

In contrast, in case of an initial state with opposite phases the observables are modulated by the scalar coupling. This modulation can simplest be separated from the slow incoherent spin exchange by Fourier transformation with respect to $\tau_m$.

In practice it may prove simpler in consequent measurings to increment the respective time interval $\tau_m$ in integer multiples of the period of oscillation caused by the scalar coupling between the spins of the nuclei A and X.

In order to transfer the longitudinal magnetization of the nuclei A and X at the end of the irradiation with the composed rf field into an observable transverse magnetization, there are several possibilities:

In an embodiment a 270° Gaussian pulse with the frequency of one of the two chemical shifts $\Omega_A$ or $\Omega_X$ is irradiated as read pulse immediately after irradiation with the composed rf field.

In a further embodiment a 270° Gaussian pulse which is modulated in amplitude by the function $\cos\omega_a t$ is irradiated as read pulse immediately after irradiation with the composed rf field. Thus the two nuclear resonance frequencies are simultaneously "hit".

Finally, in a further embodiment of the present invention a non-selective $\pi/2$ pulse may also be irradiated.

In a preferred embodiment the phase of the read pulses is alternated and combined with it the measuring signal in the detector is alternatingly added or subtracted in order to make sure that really only the remaining z-magnetization and not other transverse components are measured.

The invention will be described and explained hereafter in more detail with reference to the embodiments illustrated in the drawing. The features that can be derived from the description and the drawing may be used in other embodiments of the invention each individually or in any combination thereof.

SUMMARY OF THE INVENTION

A method for measuring cross-relation rates in high-resolution nuclear magnetic resonance (NMR) spectroscopy in which in a homogeneous static magnetic field B0 in a direction of a z-axis which causes alignment of longitudinal components $I_z^A$, $I_z^X$ of magnetization vectors $I^A$, $I^X$ of nuclei A, X during a time interval $\tau_m$ a sample substance, preferably dissolved in liquid, with nuclei A and X having different chemical shifts $\Omega_A$ and $\Omega_X$ is irradiated with a radio-frequency (rf) field and afterwards by action of a suitable rf-pulse sequence the longitudinal magnetization is transferred into a transverse magnetization creating a rf-signal received by a detector, is characterized in that the rf field is composed by at least two weak, selective component fields, the frequencies of these fields being chosen such that the magnetization vectors $I^A$ and $I^X$ an made to nutate in synchronous fashion, the remaining spins of the sample substance substantially being unaffected by this process.

DETAILED DESCRIPTION

Figure 1A:
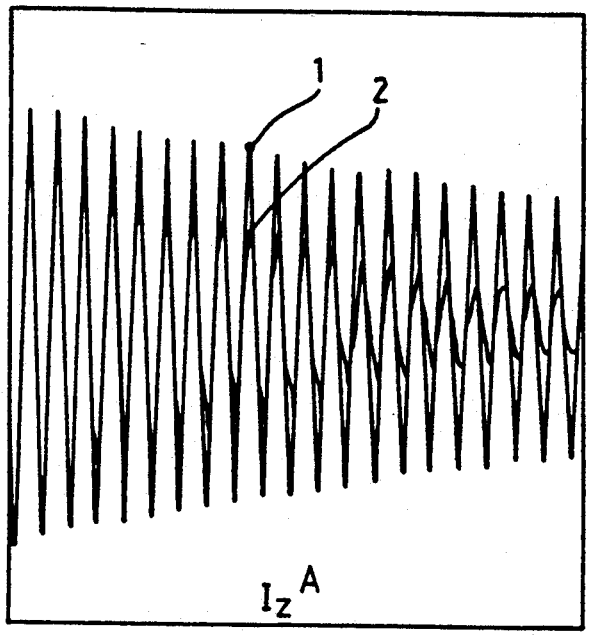
FIG. 1a shows simulations of the oscillating decay of $I_z^A$ in a two-spin AX system with $J_{AX}=0$ when both magnetization vectors are forced to nutation movement by the two sidebands of an amplitude-modulated rf field, the system starting with the initial condition $\sigma(0)=I_z^A$ and the oscillation frequency corresponding to the amplitude $\gamma_1 B_1$ of the rf field which is assumed to be perfectly homogeneous, in the limit of slow motion (1) and extreme narrowing (2)

The method described in the following uses an amplitude-modulated rf field with the carrier frequency $\omega_{rf}=\frac{1}{2}(\Omega_A+\Omega_X)$ positioned half-way between the chemical shifts of the nuclei of interest A and X. The amplitude is modulated at the frequency $\omega_a=\frac{1}{2}(\Omega_A-\Omega_X)$, so that the sidebands at $\omega_{rf}\pm\omega_a$ coincide with the two chemical shifts $\Omega_A$ and $\Omega_X$. The simplest experiment requires only one composed oscillating rf field. If the spins of the nuclei A and X do not have a scalar coupling $J_{AX}$ and if one describes this experiment in a frame rotating at $\omega_{rf}$, the Hamiltonian has the following form:

$$H=2\gamma_1 B_1 \cos\omega_a t(I_y^A+I_y^X)+\omega_a(I_Z^A-I_Z^X) \quad (1)$$

The term $2\gamma_1 B_1$ corresponds to a weak rf field along the y-axis in the rotating frame and is modulated by $\cos\omega_a t$, so that each of the two sidebands has an amplitude $\gamma_1 B_1$. The second term describes the two chemical shifts which appear at $\pm\omega_a$ with respect to the carrier frequency $\omega_{rf}$. The modulated rf irradiation must be applied to the spin system during a time interval $\tau_m$, typically long enough for cross-relation effects to manifest themselves. Typically, $\tau_m$ may be varied between 10 ms and 10 s.

A similar rf modulation can be applied to scalar-coupled AX spin system to bring about coherence transfer. In systems with a weak scalar coupling, a further term $2\pi J_{AX} I_Z^A I_Z^X$ must be added to the Hamiltonian of Eq. (1). In so-called doubly-selective homonuclear Hartmann-Hahn experiments, the magnetization of a selected site in the molecule, say of spin A, must be brought along the y-axis by a selective rf pulse prior to the application of the amplitude-modulated irradiation. This component is then spin-locked, and, provided that there is a scalar coupling $J_{AX}$ there will be a coherent transfer of transverse magnetization between A and X, oscillating with a period $2/J_{AX}$. This process may be used to sample the existence of a scalar coupling between two arbitrarily chosen spins.

In the following, however, we shall focus attention on cross-relaxation and begin by assuming that $J_{AX}=0$. The effect of the Hamiltonian of Eq. (1) on the spin system depends on the initial conditions. If the magnetization is parallel to the rf field (as in the homonuclear Hartmann-Hahn experiment) cross-relaxation cannot occur. Indeed, if the two magnetization vectors are locked by different rf fields precessing at $\omega_{rf}\pm\omega_a$, cross-relaxation averages to zero. This failure is not surprising if one remembers that non-secular terms may be neglected in Redfield's theory and is consistent with the "invariant trajectories" introduced by Griesinger et al.

If the initial condition, prior to applying the amplitude-modulated field along the y-axis contains suitable components $I_Z^A$ or $I_x^A$ that are perpendicular to the rf field, the magnetization vectors will be forced to nutate in the xz-plane, i.e. in a plane that is orthogonal to the rf field. In this case, cross-relaxation can in fact occur, provided the nutation frequency $\gamma_1 B_1$ is the same for both spins A and X.

Figure 1B:
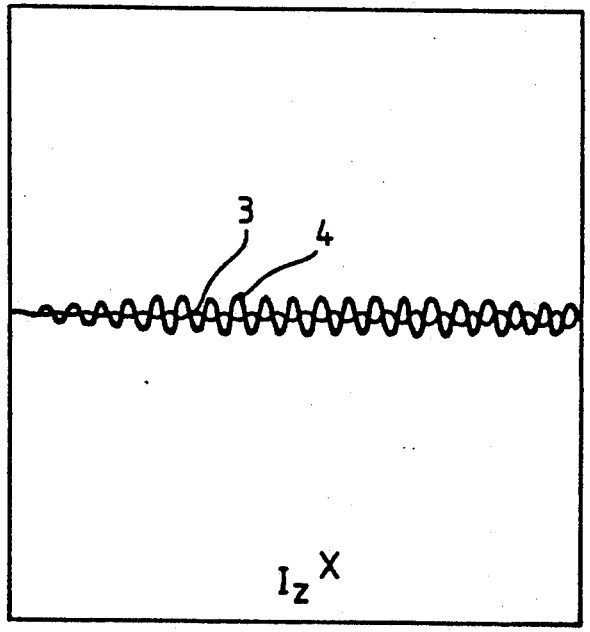
FIG. 1b shows simulations for the build-up of $I_Z^X$ under the same conditions as shown in FIG. 1a in the limit of slow, motion (3) and extreme narrowing (4)

To explain the mechanism, we shall first assume that we can modify the equilibrium density operator $\sigma$ eq $=I_Z^A+I_Z^X$, for example by saturating the X spin transitions, to obtain $\sigma(0)=I_Z^A$. FIG. 1 illustrates how during the irradiation period in the time interval $\tau_m$ the $I_Z^A$ spin component oscillates with a frequency $\gamma_1 B_1$, because the magnetization is forced to nutate in the xz-plane. The spin component $I_Z^A$ also decays because of relaxation. In the simulations of FIG. 1 the rf field is assumed to be perfectly homogeneous. At the same time one observes a slow build-up of the $I_Z^X$ spin component, superimposed on a rapid oscillation with the frequency $\gamma_1 B_1$. Bearing in mind that the two magnetization vectors are being stirred in synchronism, their z-components oscillate with the same phase, and their exchange can be described by Solomon-type equations:

$$\frac{d}{dt}\begin{pmatrix}<I_Z^A>\\<I_Z^X>\end{pmatrix}=-\begin{pmatrix}\rho'_A & \sigma'_{AX}\\ \sigma'_{AX} & \rho'_X\end{pmatrix}\begin{pmatrix}<\Delta I_Z^A>\\<\Delta I_Z^X>\end{pmatrix} \quad (2)$$

where $\Delta$ represents a deviation from equilibrium, and where the rate $\delta'_A$, $\delta'_X$ and $\sigma_{AX}$ differ from their laboratory-frame counterparts in that they must be calculated as averages over the nutation cycle. Only when both magnetization components are aligned along the z-axis can the exchange of magnetization proceed. When the components are transverse, they precess at different frequencies $+\omega_A$ and $-\omega_A$, so that in contrast to the situation pertaining to ROESY experiments transverse cross-relaxation averages to zero. The cross-relaxation rate is simply attenuated, i.e. $\sigma'_{AX} = \lambda \sigma_{AZ}$, where it can be shown that the factor is $\lambda = 2/\pi = 0.637$.

The decay and build-up curves of FIG. 1 are bi-exponential and awkward to measure. It turns out that it is quite easy to set up initial conditions in such a manner that one obtains simple exponential decays, provided $\rho'_A = \rho'_X = \rho'$ (this holds for pure dipolar relaxation, or if external fields and chemical shift anisotropy have the same effect on both sites in the molecule. The two states $$\Sigma = I_z^A + I_z^X \qquad (3)$$

$$\Delta = I_z^A - I_z^X \qquad (4)$$

correspond to eigenvectors (sometimes called "normal modes") of the coupled differential Eqs. (2), $$\Sigma(\tau_m) = \Sigma(0)\exp\{-R_a\tau_m\}\cos(\gamma B_1 \tau_m) \qquad (5)$$

with $R_1 = 2\rho' + 2\sigma'_{AX}$ $$\Delta(\tau_m) = \Delta(0)\exp\{-R_2\tau_m\}\cos(\gamma B_1 \tau_m) \qquad (6)$$

Figure 2:
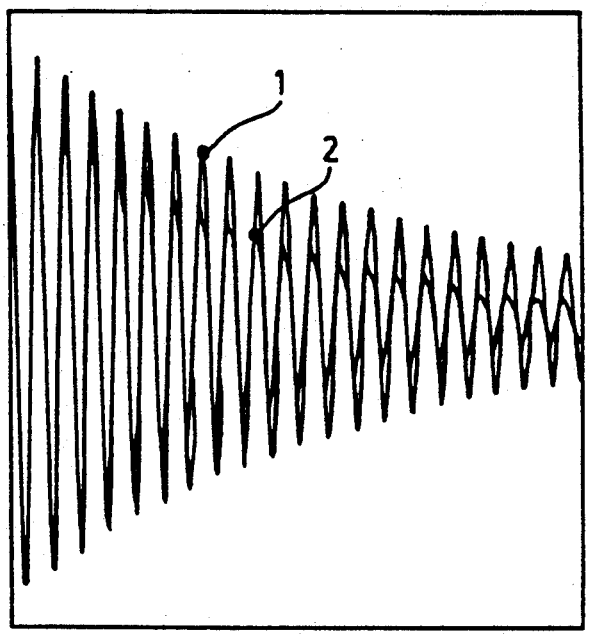
FIG. 2 shows simulations of the oscillating exponential decays of the normal modes in a two-spin AX system with $J_{AX}=0$ for $\Sigma=I_Z^A+I_Z^X$ (5) and $\Delta=I_Z^A-I_Z^X$ (6), the two magnetization vectors being forced to nutation movement by the two sidebands of an amplitude-modulated rf field as in FIG. 1.

$R_2 = 2\rho' - 2\sigma'_{AX}$ where the cosine modulation stems from the coherent nutation about the rf fields. These expressions are valid only if $\gamma B_1 >> R_1, R_2$. A realistic numerical simulation of the time-dependence of the sum and difference modes is shown in FIG. 2. Both modes feature a simple exponential decay.

Figure 3A:
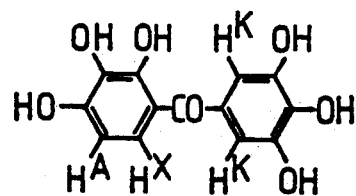
FIG. 3a shows the molecular formula with identification of the protons measured.
Figure 3B:
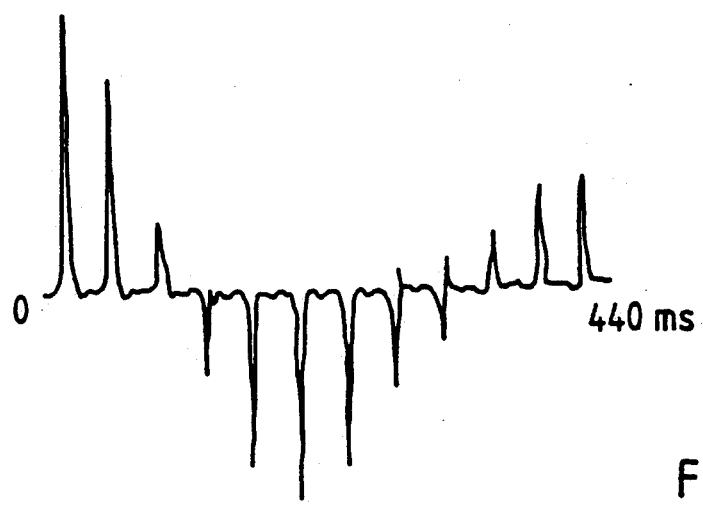
FIGS. 3b and 3c show experimental oscillating decays of the normal modes in the AK spin-subsystem of the measured molecule Exifone, where $J_{AX}=0$ and
b) $\Sigma=I_Z^Z+I_Z^K$ and
c) $\Delta=I_Z^Z-I_Z^K$.
Figure 3C:
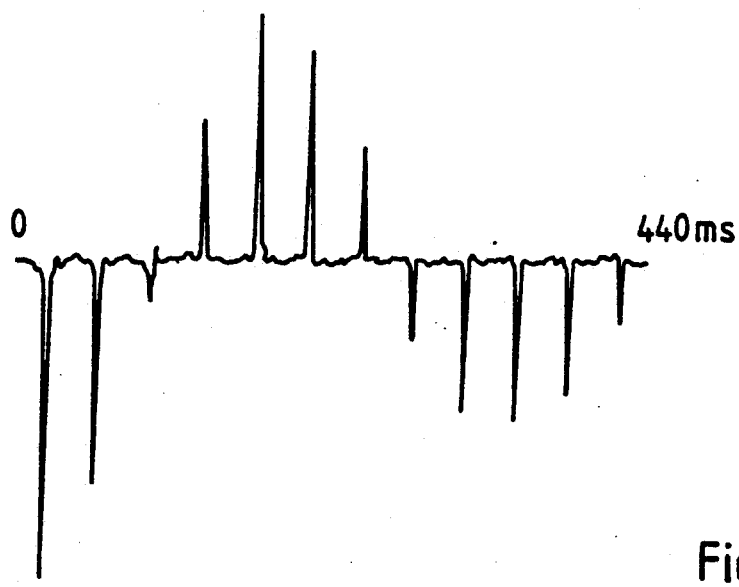

FIG. 3 shows preliminary experimental results that confirm the validity of the simulations.

The initial conditions of Eq. (4) can be set up by inverting the polarization of the X spin with a suitably shaped spin selective pulse. Eg. $G^3$ Gaussian cascades can be used for this purpose, as shown in FIG. 4b. Improved characteristics could also be obtained with band-selective (uniform response pure phase) pulses. However, selective inversion is never perfect, so that one has to live with an initial condition $\sigma(0) = I_z^A - k \cdot I_z^X$, typically with $0.8 \geq k \geq 1$. This implies of course that the initial state is not a perfect eigenvector, and consequently that the decay will be (at least slightly) biexponential. On the other hand, the sum mode $\Sigma = I_z^A + I_z^X$ will always feature an ideal mono-exponential decay.

The symmetry may be restored by exciting transverse magnetization prior to irradiation with an amplitude-modulated rf field to set up the following different initial conditions:

$$\Sigma' = I_x^A + I_x^X \qquad (7)$$

$$\Delta' = I_x^A - I_x^X \qquad (8)$$

In both cases, the magnetization components are orthogonal to the rf field which is applied along the y-axis as described in Eq. (1), so that the magnetization vectors will again be forced to nutate in the xz-plane.

Figure 4A:
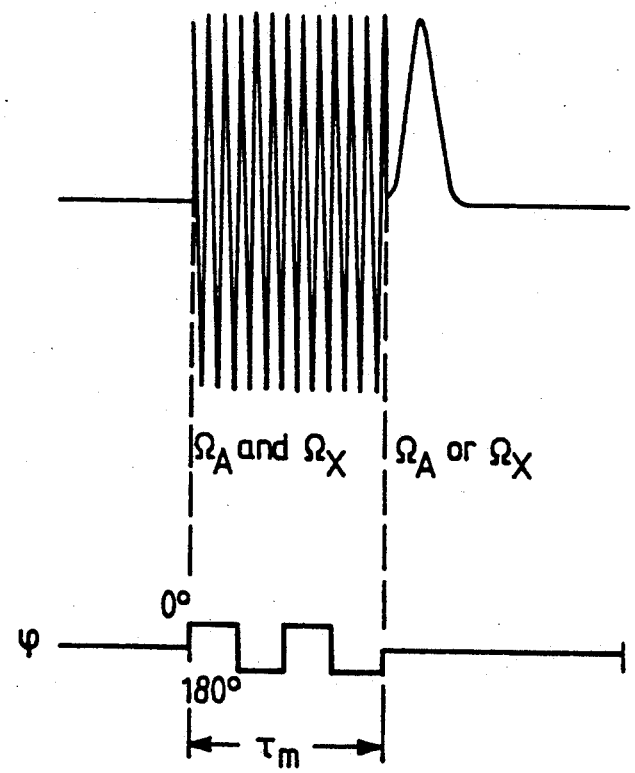
FIGS. 4a to 4c show schematic rf pulse sequences with related phase-switching scheme, where
 a) the amplitude-modulated rf irradiation period with sideband frequencies at $\Omega_A$ and at $\Omega_X$ is followed by a selective 270° Gaussian pulse applied at $\Omega_A$ or $\Omega_X$ to excite transverse magnetization of spins A or X;
 b) the time interval $\tau_m$ is preceded by a selective $G^3$ Gaussian pulse cascade at $\Omega_A$ or $\Omega_X$ to invert the magnetization of the spins A or X and the time interval $\tau_m$ is followed by a selective 270° Gaussian pulse at $\Omega_A$ or $\Omega_X$ to excite transverse magnetization of spins A or X;
 c) an amplitude-modulated selective 270° Gaussian pulse at $\Omega_A$ and $\Omega_X$ precedes in the time interval $\tau_m$ to excite the transverse magnetization of the spins A and X and the time interval $\tau_m$ is followed by a selective 270° Gaussian pulse at $\Omega_A$ or $\Omega_X$ to excite the transverse magnetization of the spins A or X.
Figure 4B:
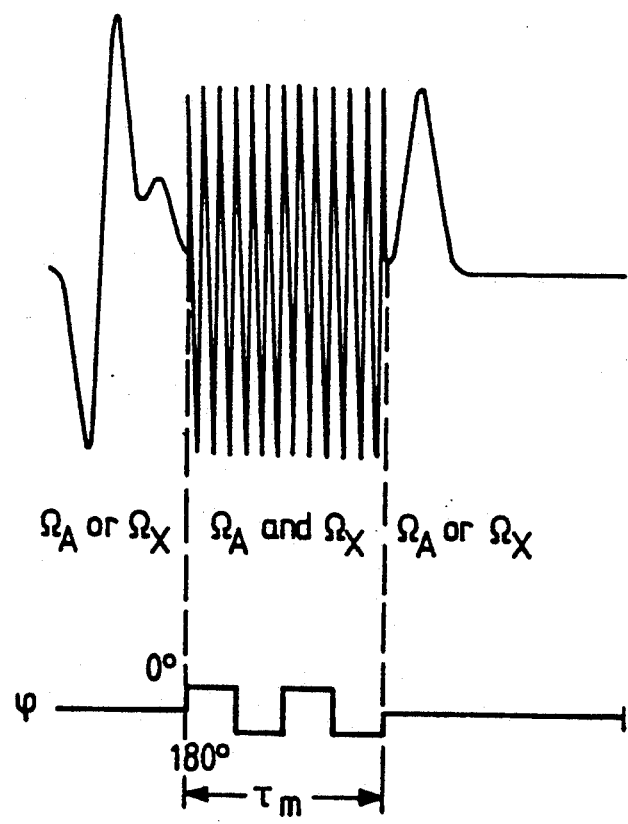
Figure 4C:
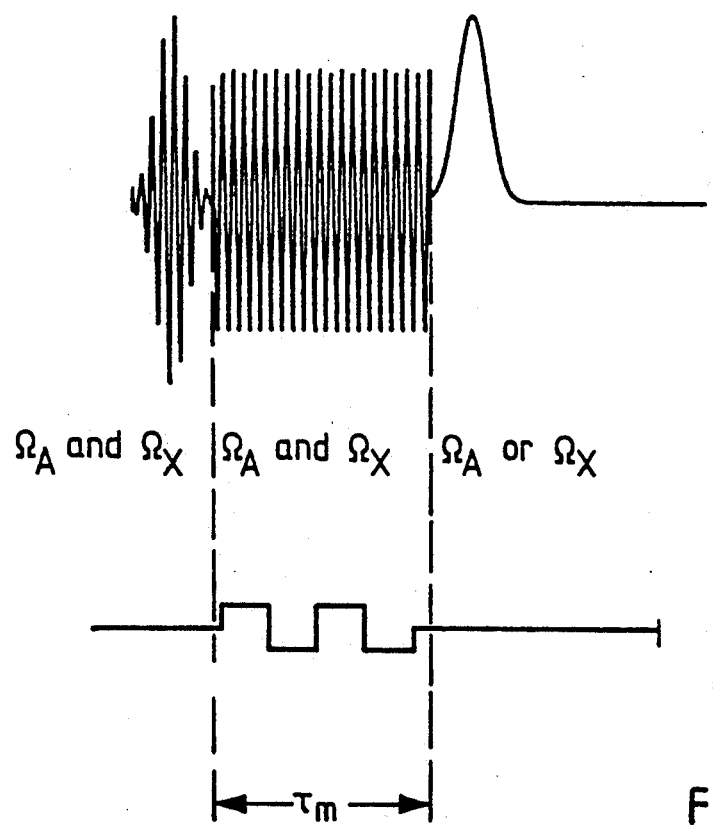

Transverse magnetization can be excited by applying a 270° Gaussian pulse just before the time interval $\tau_m$ of the irradiation with the rf field (see FIG. 4). The initial conditions of Eqs. (7) and (8) can be readily obtained if the amplitude of this Gaussian pulse is modulated in a similar way as the following rf field. This is shown schematically in FIG. 4c. This allows one to excite in-phase transverse magnetization over fairly well-defined narrow bandwidths. More sophisticated pulse shapes, such as $G^4$ cascades can also be used in connection with the amplitude modulation. If the excitation pulse is modulated by $\cos\omega_a t$ at the two magnetization components will be aligned along the +x-axis, while a pulse modulated by $\sin\omega_a t$ will align the two vectors along the +x- and -x-axes respectively.

These schemes have the advantage that one can obtain the initial states that correspond to the normal modes of Eqs. (7) and (8), even if the experimental conditions are not quite ideal.

The decay rates of the normal modes can be measured easily by recording spectra for different time intervals rm of the modulated rf irradiation. The difference of these rates immediately yields the cross-relaxation rate:

$$(\tfrac{1}{2})(R_1 - R_2) = \sigma'_{AX} = \lambda \sigma_{AX}$$

$$\lambda = 2/\pi \qquad (9)$$

$$\sigma_{AX} = -(\tfrac{1}{2})J_{AXAX}(0) + 2J_{AXAX}(2\omega_A).$$

with the autocorrelation spectral density $$J_{AXAX}(\omega_A) = (3/10)(\mu_0/4\pi)^2 \lambda_A^2 \lambda_X^2 \hbar^2 <r_{AX}^{-3}>^2[-\tau_c/(1+\omega_A^2\tau_c^2)] \qquad (10)$$

where $J_{AXAX}(\omega_A)$ means the spectral density of the autocorrelation in a two spin system AX in dependence on the larmor frequency $\omega_A$ of the nucleus A, $\mu_0$ means the permeability of the vacuum, $\gamma_{A,X}$ means the gyromagnetic conditions of the nuclei A, X, $\hbar = h/2\pi$ means the modified Planck's constant, $r_{AX}$ means the distance of the nuclei A and X and $\tau_c$ means the correlation time of the molecular rotational diffusion. It has to be noted that for the limit of slow motion $J_{AXAX}(0) >> J_{AXAX}(2\omega_A)$, hence $\sigma_{AX} < 0$, so that $R_2 > R_1$ applies. In other words, the difference mode $\Delta$ decays faster than the sum mode $\Sigma$ in this case. The reverse applies in the extreme narrowing condition.

In spite of the presence of the rf field, it should be emphasized that the method according to the present invention yields the cross-relaxation rate in the laboratory frame, i.e. the same rate that one normally measures in the absence of rf irradiation, as in so-called NOESY experiments, and not the rate applicable to the rotating frame as in "ROESY" experiments. It may be appreciated in FIG. 1 that in extreme narrowing, the amplitudes of $I_z^A$ and $I_z^X$ always have opposite sign, while for slow motion, these amplitudes have the same sign at all times in the modulation cycle. This is also analogous to the laboratory-frame transient Overhauser effect.

Like in conventional Overhauser studies, calibration with the help of experiments involving pairs of nuclei with known distances and similar correlation times allows one to determine an unknown internuclear distance $r_{AX}$ from the measurement of the cross-relaxation rate. However, in contrast to the conventional experiments, when the method of the present invention is applied perturbations due to other spins can be ignored, at least if their chemical shifts are sufficiently remote from the two sidebands of the modulated rf irradiation.

So far, we have assumed that $J_{AX}=0$, as indeed often applies when one studies Overhauser effects between spins that reside, say, on different amino acids of a peptide or protein. If however, the scalar coupling constant $J_{AX}$ (not to be mixed up with the spectral density of the autocorrelation $J_{AXAX}$) does not vanish, there will be a coherent exchange of magnetization. This will not affect the experiment starting with in-phase magnetization, but it will lead to a modulation of the observables if we begin with opposite phases. This modulation can in principle be separated from the slow incoherent exchange by Fourier transformation with respect to $\tau_m$. In practice, if $J_{AX}$ is known, it may be simpler to increment $\tau_m$ in multiples of the oscillation period caused by the scalar coupling.

In systems with vanishing scalar couplings $J_{AM}$, $J_{KX}$ to "passive" spins M and K, the rf amplitude $\gamma_1 B_1$ should be sufficient to force all resonances of spins A and X to be stirred with the same nutation frequency. If this condition is fulfilled, the scalar couplings $J_{AM}$ and $J_{KX}$ will be effectively decoupled during the time interval $\tau_m$. On the other hand, $\gamma_1 B_1$ should be weak enough so that neighboring "passive" spins are not affected. Typically, an amplitude $\gamma_1 B_1/2\pi \approx 50$ Hz seems a reasonable compromise.

It may be easier to fulfill these somewhat contradictory requirements if the magnetization is aligned along the effective field, in the manner of spin-locking experiments. This observation leads to an alternative approach that uses an irradiation that is modulated both in amplitude and phase. In a frame rotating $\omega_{rf}$, the Hamiltonian during the time interval $\tau_m$ of the irradiation with the rf field has the following form:

$$H = [2\lambda_1 B_1(I_y^A + I_y^X) + 4\lambda_2 B_2 \cos \lambda_1 B_1 t(I_x^A + I_x^X)] \cos \omega_a t + \omega_d (I_z^A - I_z^X) \quad (11)$$

This Hamiltonian can be used with the following initial conditions:

$$\Sigma'' = I_y^A + I_y^X \quad (12)$$

$$\Delta'' = I_y^A - I_y^X \quad (13)$$

The $2\gamma_1 B_1$ term in the Hamiltonian, which is again modulated by $\cos\omega_a t$ so that the rf spectrum splits up into two sidebands, each with an amplitude $\gamma_1 B_1$, allows one to spin-lock the two magnetization vectors. The rf amplitude should be sufficient to efficiently lock the resonances of spins A and X, even if they are split up into multiplets as a result of scalar couplings to surrounding spins. On the other hand, $\gamma_1 B_1$ should be weak enough so that neighboring "passive" spins are not affected. Typically, an amplitude $\gamma_1 B_1/2\pi \approx 50$ Hz again seems a reasonable compromise in this case.

The second term in Eq. (11) corresponds to a field $4\gamma_2 B_2$ applied along the y-axis of the rotating frame, orthogonal to the first $B_1$ field. To understand the purpose of this second field, it has to be recalled that if the magnetization is not aligned with the main spin-locking field $B_1$ along the y-axis, it precesses about $B_1$ at a frequency $\gamma_1 B_1$. Now the modulation of the second field by $\cos\omega_a t$ also splits its spectrum into two sidebands at frequencies $\omega_{rf} \pm \omega_a$, each with an amplitude $2\gamma_2 B_2$. Furthermore, the second field is modulated at the frequency $\gamma_1 B_1$. In a rotating frame where one of the chemical shifts $\Omega_1$ or $\Omega_2$ appears stationary, the field $2B_2$ appears to be oscillating along the $\pm$x-axis. This field can be decomposed into two counter-rotating components, each of amplitude $B_2$, precessing in a plane perpendicular to the magnetization vector. Since the $B_2$ field oscillates at the frequency $\gamma_1 B_1$, one of these counter-rotating components will be at all times orthogonal to the magnetization vector, exerting a torque so that it will be gradually taken away from its initial position along $B_1$, on a path on the unit sphere that spirals outward from the y-axis, cuts through the xz-plane and then spirals inward to converge towards the $-y$-axis. From there it will again spiral outward to the xz-plane and then return to the $+y$-axis in a periodic motion. The period of this motion is $2\pi/(\gamma_2 B_2)$. The spin-lock pulse must be interrupted after an integer number of such cycles, so that the magnetization lies along the $+y$-axis, thus allowing a signal to be observed.

Typically, if $\gamma_1 B_1/2\pi$ is on the order of 50 Hz, $\gamma_2 B_2 2\pi$ could be 5 Hz, i.e. the period of the spiraling motion would be 0.2 s. Thus the $B_2$ field in Eq. (11) provides merely a small perturbation with respect to the $B_1$ field. The resultant of the two orthogonal vectors has a time-dependent phase that wobbles through a range of mere $\pm 5.7°$ about the y-axis.

With the experiment described by Eq. (11), one can study cross-relaxation between two selected spins. If one considers the initial condition of Eq. (12) with both vectors along the y-axis at the beginning of the spin-lock period, it is clear that they follow similar paths, provided one considers each vector in its own rotating frame. However, in a common reference frame, for example in a frame rotating at the carrier frequency $\omega_{rf}$, their paths would appear quite different. Yet if we focus attention on the longitudinal components $I_z^A$ and $I_z^X$, we find that their time-dependence is identical:

$$I_z^A = I_z^X = \sin \gamma_2 B_2 \tau_m \sin \gamma_1 B_1 \tau_m \quad (14)$$

Thus these two z-components are stirred in synchronism. This implies that they are subject to cross-relaxation, as may be rationalized in terms of "invariant trajectories". If one chooses the initial condition of Eq. (13), the longitudinal magnetization components remain at all times opposite throughout the stirring process. In the slow motion limit, cross-relaxation leads to an accelerated decay of the difference mode, while it is the sum mode that decays faster in the extreme narrowing limit.

So far, we have assumed that the rf fields are perfectly homogeneous. In actual fact, the nutation frequency about $B_1$ in Eq. (1), or, for that matter, about $B_1$ and $B_2$ in Eq. (11), will be subject to inhomogeneous broadening. Thus Eqs. (5) and (6) should be amended by appending a monotonically decaying function $f(\tau_m)$ $$\Sigma(\tau_m) = \Sigma(0) \exp\{-R_1\tau_m\} \sin(\gamma B_1 \tau_m) f(\tau_m) \quad (15)$$

$$\Delta(\tau_m) = \Delta(0) \exp\{-R_2\tau_m\} \sin(\gamma B_1 \tau_m) f(\tau_m) \quad (16)$$

If the spatial distribution of the rf field amplitudes is Lorentzian, the function $f(\tau_m)$ will be exponential. While inhomogeneous broadening cannot affect cross-relaxation, which is of course intramolecular, i.e. between spins that "see" the same rf field, it does affect the observables since these are averages over the bulk sample. Fortunately, it is possible to combat the negative effects of inhomogeneous decay by switching the phase of $B_1$ (and, if applicable, of $B_2$) through 180° in the middle of a time interval $\tau_m$. If diffusion is a problem, it is possible to switch the rf phases several times at regular intervals. If the difference in chemical shifts is $\Omega_A - \Omega_X = 2\omega_a$, it can be shown that the rf phase must be switched at intervals corresponding to multiples of $\pi/\omega_a$ to avoid destructive interference. In this manner, amplitude-inhomogeneous dephasing is refocused to form a rotary echo at the end of the spin-locking period.

With the modulation scheme of Eq. (1) the irradiation with the rf field is interrupted after an integer number of modulation cycles $2\pi/\gamma_1 B_1$, so that the magnetization is again along the z-axis. It can then be converted into observable transverse magnetization eg. by applying a 270° Gaussian pulse at either resonance frequency, or by applying an amplitude-modulated 270° Gaussian pulse so as to hit both resonance frequencies simultaneously, or by applying a non-selective 90° pulse. Whatever scheme is chosen, a phase-alternation of the read pulse, combined with alternating addition and substraction of the measuring signal, is recommended to make sure that one really does observe the remaining z-magnetization rather than some residual transverse components.

Figure 5A:
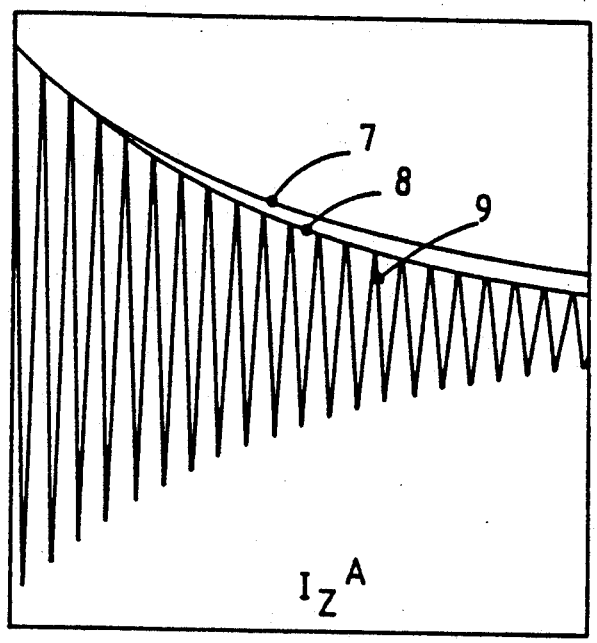
FIG. 5a shows simulations of the decay of $I_Z^A$ in a two-spin AX system with $J_{AX}=0$ in the limit of extreme narrowing, the system starting with the initial condition $\sigma(0)=I_Z^A$ and the oscillation frequency corresponding to the amplitude $\gamma_1 B_1$ of the rf field which is applied along the y-axis and is assumed to be perfectly homogeneous in the cases of normal laboratory-frame decay of $I_Z^A$ (7), decay of $I_Z^A$, when only X is irradiated (8), decay of $I_Z^A$, when only A is irradiated (9)
Figure 5B:
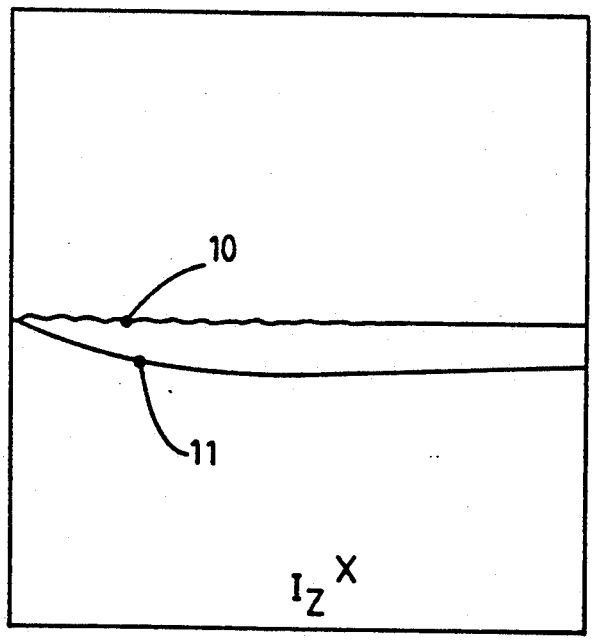
FIG. 5b shows simulations of the build-up of $I_Z^X$ in a two-spin AX system with $J_{AX}=0$ in the limit of extreme narrowing, the system starting with the initial condition $\sigma(0)=I_Z^A$ and the oscillation frequency corresponding to the amplitude $\gamma_1 B_1$ of the rf field which is applied along the y-axis and is assumed to be perfectly homogeneous in the case of absence of build-up of $I_Z^X$, when only A or only X is irradiated (10), and normal laboratory-frame build-up of $I_Z^X$ (11).

If one considers spin systems that contain one or several passive spins M, K, etc., the cross-relation rates $\sigma'_{AM}$ and $\sigma'_{KX}$ are all quenched during the modulated rf irradiation. FIG. 5a and 5b show simulations which provide support for this crucial clam. In the curves 7 and 11 none of the two magnetization vectors is stirred by the rf irradiation, so that normal cross-relaxation is observed in the laboratory system. Curve 8 shows the decay of $I_Z^A$ when only spin X is affected by one of the two sidebands of the amplitude-modulated rf irradiation. Curve 9 shows the oscillating decay of $I_Z^A$, if only spin A is affected by one of the two sidebands of the amplitude-modulated rf irradiation and curve 10 shows the absence of a build-up of $I_Z^X$ when either spin X or spin A is affected by one of the two sidebands. These simulations prove that cross-relaxation is efficiently quenched when only one of the two spins is stirred, while the other is not. This makes it possible to study the cross-relaxation rate $\sigma_{AX}$ between two selected spins as if they were isolated from the surrounding spins, provided of course that the chemical shifts of the two active spins are distinct from each other and from those of the passive spins.

If these conditions are fulfilled, it is possible to measure internuclear distances directly from cross-relaxation rates measured with the schemes proposed above, even in cases where normal laboratory-frame Overhauser effects are perturbed by neighboring spins.

What is claimed is:

1. Method for measuring cross-relation rates in a sample using high resolution nuclear magnetic resonance (NMR) spectroscopy in which a homogeneous static magnetic field $B_0$, in a direction of a Z-axis, causes alignment of longitudinal components $I_Z^A$, $I_Z^X$ of magnetization vectors $I^A$, $I^X$ of nuclei A, X during a time interval $\tau_m$, said A, X nuclei having different chemical shifts $\Omega_A$ and $\Omega_X$, said method comprising the steps of:
   irradiating the sample with a composed radio-frequency (rf) field comprising at least two weak, selective component fields with frequencies selected in order to cause the magnetization vectors $\vec{I^A}$ and $\vec{I^X}$ to nutate in a synchronous fashion, remaining spins of the sample substance being substantially unaffected; and
   subjecting the sample to a rf-pulse sequence in order to transfer longitudinal magnetization into a transverse magnetization and create a rf-signal for reception by a detector.

2. Method according to claim 1 wherein the amplitudes and frequencies of the component fields are chosen such that together they form an amplitude-modulated rf field in a direction of a y-axis orthogonal to the z-axis with a carrier frequency $\omega rf = \frac{1}{2}(\Omega_A + \Omega_X)$ and two sideband frequencies $\omega rf + \omega a$ and $\omega rf - \omega a$, with $\omega a = \frac{1}{2}(\Omega_A - \Omega_X)$.

3. Method according to claim 2, wherein a field amplitude of the composed rf field follows the function $2\gamma_1 B_1 \cos\omega a^t$ with $\gamma_1 B_1/2\pi$ meaning the amplitude of the two sidebands.

4. Method according to claim 2, wherein sideband amplitudes $\gamma_1 B_1/2\pi$ are chosen sufficient to stir the spins of the nuclei A and X with the same nutation frequency, but weak enough so that the spins of all neighboring other nuclei are not affected.

5. Method according to claim 3, wherein the time interval $\tau_m$ is chosen to be integer multiple of the duration of a modulation cycle $2\pi/\gamma_1 B_1$.

6. Method according to claim 1, wherein the phases of the component fields are spaced from each other by 90° and have amplitudes and frequencies chosen such that combination of the component field yields a phase-modulated rf field orthogonal to the z-axis with a carrier frequency $\omega rf = \frac{1}{2}(\Omega_A + \Omega_X)$ and two side-band frequencies $\omega rf + \omega a$ and $\omega rf - \omega a$, with $\omega a = \frac{1}{2}(\Omega_A - \Omega_X)$.

7. Method according to claim 6, wherein a field amplitude of one component field follows a function $\gamma_1 B_1 \cdot \cos\omega_a t$ and a field amplitude of another component field follows a function $\gamma_2 B_2 \cdot \cos\omega_a t \cdot \gamma_1 B_1 t$, with $\gamma_1 B_1/2\pi$ meaning an extreme amplitude of the one component field and $\gamma_2 B_2/2\pi$ meaning an extreme amplitude of the other component field.

8. Method according to claim 7, wherein the time interval $\tau_m$ is chosen to be an integer multiple of a duration of a modulation cycle $2\pi/\gamma_2 B_2$.

9. Method according to claim 7, wherein the extreme amplitudes $\gamma_1 B_1/2\pi$ and $\gamma_2 B_2/2\pi$ are chosen so that $10 \text{ Hz} \leq \gamma_1 B_1/2\pi \leq 100 \text{ Hz}$, and $\gamma_1 B_1/\gamma_2 B_2 \geq 1$.

10. Method according to claim 1, wherein phases of all component fields are switched through 180° at least once during the time interval $\tau_m$.

11. Method according to claim 10, wherein the phases are switches at an odd number during a time interval $\tau_m$ and a time duration $\tau 180$, of the irradiation of the rf field with a phase switched through 180°, is chosen to be equal to a time duration $\tau_0$ of the irradiation of the rf field with a phase switched through 0°.

12. Method according to claim 11, wherein the time durations of the single intervals $\tau 180$, $\tau_0$ with switched phase are equal and an odd multiple of $\tau/\omega a$.

13. Method according to claim 1, wherein the sample, prior to irradiation of the compound rf field, is irradiated with a shaped selective rf pulse sequence causing an inversion of the spin polarization of the nuclei X in relation to the nuclei A.

14. Method according to claim 13, wherein the selective rf pulse sequence comprises a $G^3$ Gaussian pulse cascade.

15. Method according to claim 13, wherein the selective rf pulse sequence comprises band-selective uniform response pure phase pulses.

16. Method according to claim 1, wherein the sample substance, prior to irradiation of the composed rf field, is irradiated with a rf pulse sequence for exciting transverse magnetization of the nuclei A and X.

17. Method according to claim 16, wherein rf pulse sequence is amplitude modulated by one of $\sin\omega_a t$ and $\cos\omega_a t$.

18. Method according to claim 17, wherein the selective rf pulse sequence comprises a 270° Gaussian pulse.

19. Method according to claim 17, wherein the selective rf pulse sequence comprises a $G^4$ Gaussian cascade.

20. Method according to claim 1, wherein modulations of measuring variables caused by scalar coupling between the spins of the nuclei A and X are separated from the slow incoherent spin exchange by Fourier transformation with respect to $\tau_m$.

21. Method according to claim 1, wherein in consequent measuring the time interval $\tau_m$ is incremented in integer multiples of a period of oscillation caused by scalar coupling between the spins of the nuclei A and X.

22. Method according to claim 1, wherein a 270° Gaussian pulse with the frequency of one of the two chemical shifts $\Omega_A$ or $\Omega_X$ is irradiated as a read pulse immediately after irradiation of the sample with the composed rf field.

23. Method according to claim 2, wherein a 270° Gaussian pulse, modulated in amplitude by a function $\cos\omega_a t$ is irradiated as a read pulse immediately after irradiation of the sample with the composed rf field.

24. Method according to claim 1, wherein a nonselective $\pi/2$ pulse is irradiated as read pulse immediately after irradiation of the sample with the composed rf field.

25. Method according to claim 22, wherein a phase of the read pulse is alternated and combined with a measuring signal in a detector.

* * * * *